United States Patent [19]

Soulard

[11] Patent Number: 4,746,766

[45] Date of Patent: May 24, 1988

[54] SHIELDED FLEXING CONNECTOR

[75] Inventor: Roger R. Soulard, Dracut, Mass.

[73] Assignee: Wang Laboratories, Inc., Lowell, Mass.

[21] Appl. No.: 24,735

[22] Filed: Mar. 11, 1987

[51] Int. Cl.$^4$ ........................ H02G 11/00; H05K 9/00; H01B 7/04; B41J 25/28

[52] U.S. Cl. ........................................ 174/36; 174/69; 174/106 R; 174/108; 191/12 R; 346/76 PH; 400/320; 400/719

[58] Field of Search ............... 174/36, 69, 106 R, 108, 174/117 R, 117 F, 117 FF, 117 PC; 191/12 R; 346/76 PH, 139 R; 360/106; 361/398, 408; 400/320, 719; 339/17 F, 28, 29, 176 MF

[56] References Cited

U.S. PATENT DOCUMENTS 3,907,090 9/1975 Northfield et al. ........ 346/76 PH X

FOREIGN PATENT DOCUMENTS 106045 12/1966 Denmark ............................ 174/69

1269243 7/1961 France ............................... 174/108

699558 11/1953 United Kingdom ............ 174/117 F

*Primary Examiner*—Laramie E. Askin

*Attorney, Agent, or Firm*—Michael H. Shanahan

[57] ABSTRACT

A flexing connector for suppressing electromagnetic radiation from an electrical cable connecting moving and stationary elements of a machine has a shield surrounding a signal cable which includes an inner coil of wire wound in a generally helicoidal form with a flat cross-section with the signal cable positioned within the coil. An outer coil similar to the first, but with somewhat larger cross-section and wound with a different chirality, surrounds the inner coil. The coils are made from hardened steel, which is both electrically conductive and ferromagnetic. The two coils and the cable are clamped together on either side of a moving loop extending between the moving and stationary elements so that the coils cannot elongate and spread their windings apart as the connector is flexed.

4 Claims, 2 Drawing Sheets

SHIELDED FLEXING CONNECTOR

BRIEF SUMMARY OF THE INVENTION

In a printing machine electrical signals controlling the operation of a print head are commonly sent from a computer situated on the machine frame to a moving carriage bearing the print head over a flat cable with a plurality of conductors running alongside one another. This cable is installed with a loop which flexes and moves to accommodate the movement of the carriage during printing. The electrical currents in the conductors of the cable generate electromagnetic radiation which is propagated into the environment and may be objectionable.

In a flexing connector according to the invention this radiation is suppressed while the ability of the connector to flexibly loop and accommodate the movement of the platform is unimpaired. The connector according to the invention features a shield surrounding a signal cable which includes an inner coil of wire wound in a generally helicoidal form with a flat cross-section with the signal cable positioned within the coil. An outer coil similar to the first, but with somewhat larger cross-section and wound with a different chirality, surrounds the inner coil. These flat springy coils are very flexible and readily accommodate the moving loop of the cable.

The coils are advantageously made from hardened steel wire which is both electrically conductive and ferromagnetic. The ferromagnetic property of the coil material is particularly effective in suppressing the longer wavelength components of the radiation from the cable, while the conductive property is particularly effective in suppressing the shorter components, so that the combination of these properties is especially advantageous.

Because the coil windings are of different chiralities, the wires of the outer coil cannot line up with those of the inner coil so that the spaces between the windings of one coil cannot superimpose on those of the other. The integrity of the radiation shield is further assured by clamping the two coils and the cable together on either side of the moving loop so that the coils cannot elongate and spread their windings apart as the connector is flexed.

A sheet of spring material such as hardened steel may advantageously be placed beside the electrical cable within the coils. This prevents dropping of the loop of the connector when the connector is positioned with its loop having a vertical axis.

DETAILED DESCRIPTION

Figure 1:
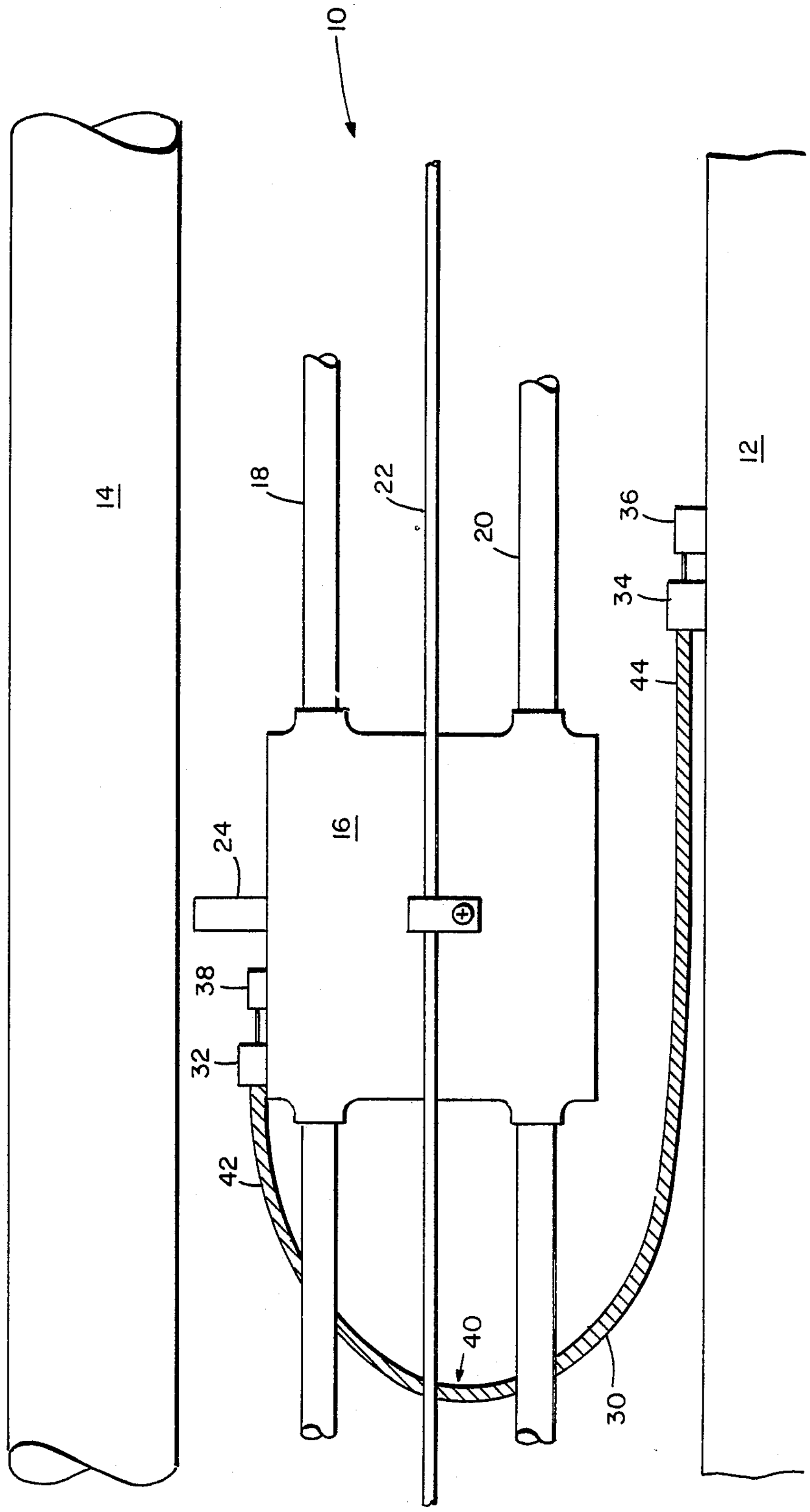
FIG. 1 is a plan view of a portion of a machine exemplified as a printer with a flexing connector according to the invention.

In FIG. 1 is shown portions of a printer machine 10, including a portion of stationary grounded frame 12 of the printer, a platen 14, and movable printing platform 16. Platform 16 is moved right and left on rails 18, 20 by draw cable 22 to move printing head 24 along platen 14. Flexing connector 30, according to the invention, is clamped at one end by clamp 32 to platform 16 and on its other end is clamped by clamp 34 to stationary frame 12. Connector 30 provides a plurality of electrical connections between stationary terminal 36 on frame 12 and moving terminal 38 on moving platform 16. Moving loop 40 of connector 30 is situated between end 42 of connector 30 clamped to platform 16 and end 44 of connector 30 clamped to stationary component 12 to accommodate the motion of platform 16 along rails 18,20.

Figure 2:
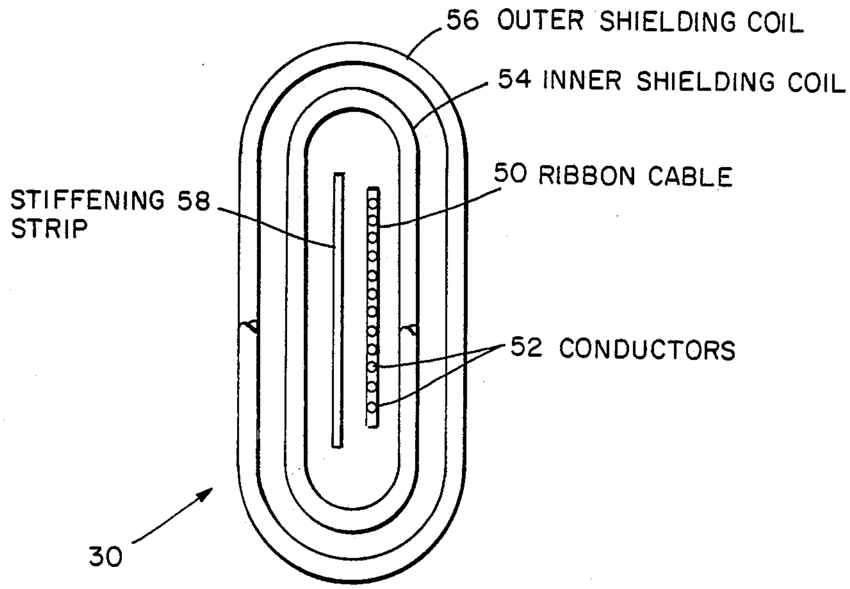
FIG. 2 is a cross-section view through the flexing connector of FIG. 1.
Figure 3:
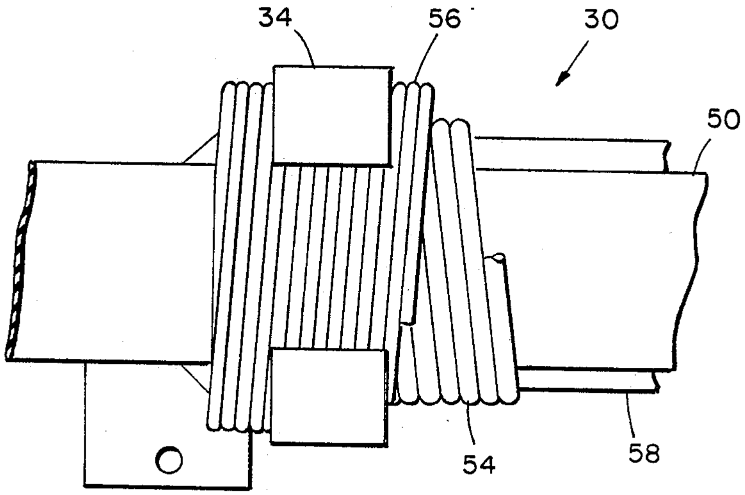
FIG. 3 is a detail view with parts broken away of an end of the flexing connector of FIG. 1.

As shown more particularly in FIGS. 2 and 3, flexing connector 30 includes flat ribbon cable 50 with a plurality of electrical conductors 52, which run parallel along the length of the cable and provide electrical connections between stationary terminal 36 and moving terminal 38. Inner shielding coil 54, made of an electrically conductive ferromagnetic material such as hardened steel wire which is formed into a flat helicoidal form with a generally flat cross-section, coils around and encloses cable 50. Outer shielding coil 56, made of similar material and of similar shape but coiling with opposite chirality, coils around and encloses coil 54. Stiffener strip 58, advantageously made of a springy material such as spring steel, lies beside cable 50 and within coil 54.

As shown particularly in FIG. 3, clamp 34, situated at one end of connector 30 and made of electrically conductive material, squeezes together the coils and parts interior thereto so as to fix the relative positions of the two coils, the cable, and the strip at the point clamped. Clamp 34 presses outer coil 56 against inner coil 54 to ensure electrical contact between the inner and outer coils and the clamp. Clamp 34 is attached to a grounded structure 12 of the machine and connects the two coils to each other and to ground.

Another clamp 32 positioned on the opposite side of loop 40 from clamp 34 also clamps together the coils and parts interior thereto. Clamps 32 and 34 are clamped in place with the successive turns of the coils 54, 56 pushed together so as to leave small gaps or none between successive turns.

In operation, printing platform 16 is moved right and left on rails 18, 20 to position print head 24 appropriately along platen 14 while loop 40 of connector 30 rolls to accommodate this motion. Stiffening strip 58 prevents loop 40 from drooping when the axis of the loop is vertical while allowing connector 30 to flex freely around the loop axis. Electrical currents for controlling the print head are sent along conductors 52. Escape of the electromagnetic radiation accompanying these currents is suppressed by the two coils surrounding cable 50.

What is claimed is:

1. A flexing connector for making a plurality of electrical connections between a stationary terminal on a stationary component of a machine such as a printer and a moving terminal on a movable component of said machine, said flexing connector comprising a flat ribbon cable having a plurality of distinct electrical conductors therein running parallel the length of said ribbon cable, said conductors for providing electrical connections between said stationary terminal and said moving terminal, said cable having a movable loop between a portion affixable to said stationary component and a portion affixable to said movable component, an inner coil of hardened steel shielding material wound in a helicoidal form of a first chirality and having a generally flat cross-section, said inner coil coiling around said ribbon cable and being electrically connectable to a ground structure of said machine, and an outer coil of hardened steel shielding material wound in a helicoidal form of a second chirality and having a generally flat cross-section, said outer coil coiling around said inner coil and being electrically connectable to a ground structure of said machine.

2. A flexing connector as claimed in claim 1, including a first clamp clamping together said cable, said inner coil, and said outer coil and establishing electrical contact between said inner coil and said outer coil.

3. A flexing connector as claimed in claim 2, including a second clamp clamping together said cable, said inner coil, and said outer coil, said clamps being positioned on opposite sides of said loop of said cable and preventing said coils from elongating or contracting with respect to the cable held therebetween.

4. A flexing connector as claimed in claim 1, including a strip of flat springy material lying beside said cable within said outer coil.

* * * * *